United States Patent
Huang et al.

(10) Patent No.: US 9,030,015 B2
(45) Date of Patent: May 12, 2015

(54) THREE DIMENSIONAL STACKED STRUCTURE FOR CHIPS

(71) Applicants: Tsai-Yu Huang, Zhubei (TW); Yi-Feng Huang, New Taipei (TW)

(72) Inventors: Tsai-Yu Huang, Zhubei (TW); Yi-Feng Huang, New Taipei (TW)

( * ) Notice: Subject to any disclaimer, the term of this patent is extended or adjusted under 35 U.S.C. 154(b) by 0 days.

(21) Appl. No.: 14/147,293

(22) Filed: Jan. 3, 2014

(65) Prior Publication Data

US 2014/0191234 A1    Jul. 10, 2014

(30) Foreign Application Priority Data

Jan. 4, 2013 (TW) ............................. 102100320 A (51) Int. Cl.
*H01L 23/52* (2006.01)
*H01L 23/522* (2006.01)
*H01L 21/66* (2006.01)

(52) U.S. Cl.
CPC ............ *H01L 23/5226* (2013.01); *H01L 22/32* (2013.01); *H01L 2924/0002* (2013.01)

(58) Field of Classification Search
CPC ..... H01L 22/32; H01L 22/34; H01L 27/0688; H01L 27/0694; H01L 23/5226; H01L 23/49838; H01L 2924/0002; H01L 2924/00; H01L 2924/00014
USPC .......................................... 257/48, 758, 774
See application file for complete search history.

(56) References Cited

U.S. PATENT DOCUMENTS

| | | | | |
|---|---|---|---|---|
| 7,816,776 B2* | 10/2010 | Choi | ............................. | 257/686 |
| 7,986,033 B2* | 7/2011 | Barth | ............................. | 257/686 |
| 8,866,281 B2* | 10/2014 | Huang | ............................. | 257/686 |
| 2006/0051949 A1* | 3/2006 | Nemoto | ............................. | 438/597 |
| 2009/0039492 A1* | 2/2009 | Kang et al. | ............................. | 257/686 |
| 2011/0049515 A1* | 3/2011 | Kuo et al. | ............................. | 257/48 |
| 2011/0248396 A1* | 10/2011 | Liu et al. | ............................. | 257/686 |
| 2011/0266683 A1* | 11/2011 | Feng | ............................. | 257/773 |
| 2012/0074541 A1* | 3/2012 | Ito et al. | ............................. | 257/659 |
| 2012/0074580 A1* | 3/2012 | Nalla et al. | ............................. | 257/774 |
| 2012/0133381 A1* | 5/2012 | Bruland et al. | ............................. | 324/754.03 |
| 2014/0021599 A1* | 1/2014 | Huang | ............................. | 257/737 |

* cited by examiner

*Primary Examiner* — Nikolay Yushin
(74) *Attorney, Agent, or Firm* — Chih Feng Yeh; Huntington IP Consulting Co., Ltd.

(57) ABSTRACT

A 3-D chip stacked structure is disclosed. Each chip layer is provided with plural single-layered conductive members where among the same chip layer the two adjacent conductive members are structurally formed in mirror symmetric way with each other along a chip longitudinal direction and the arrangements of the single-layered conductive members of the two adjacent chip layers are shifted by a test pad distance. The single-layered conductive members of the two adjacent chip layers are communicated through a vertical TSV (through silicon via). Therefore, a selection signal or an enabling signal might be transferred through this specific metal layer and related TSV to reach targeting chip layer and targeting circuit.

16 Claims, 9 Drawing Sheets

THREE DIMENSIONAL STACKED STRUCTURE FOR CHIPS

TECHNICAL FIELD

The present invention is generally relevant to a semiconductor structure, specifically, a three dimensional stacked structure of chips, with better efficiency of arrangement.

BACKGROUND

With the tendency towards miniaturization and multifunctional development of electronic devices, semiconductor devices are forced to be highly integrated. In response to this demand, the so-called Multi-chip Package has been proposed, which involves the integration and stacking of a plurality of chips, as well as the use for limited space.

Figure 1:
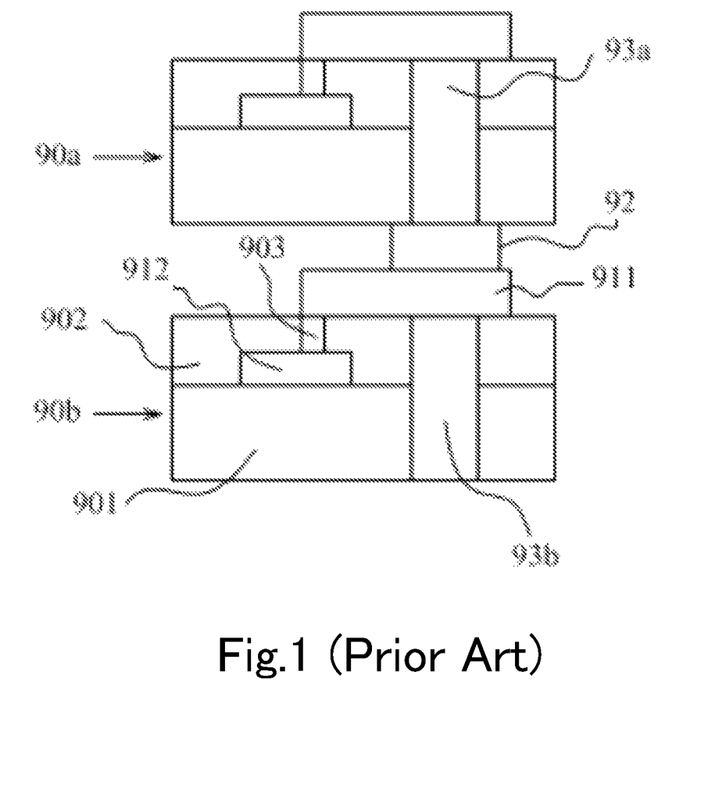
FIG. 1 illustrates a schematic view of a conventional stacked structure of chips.
Figure 2:
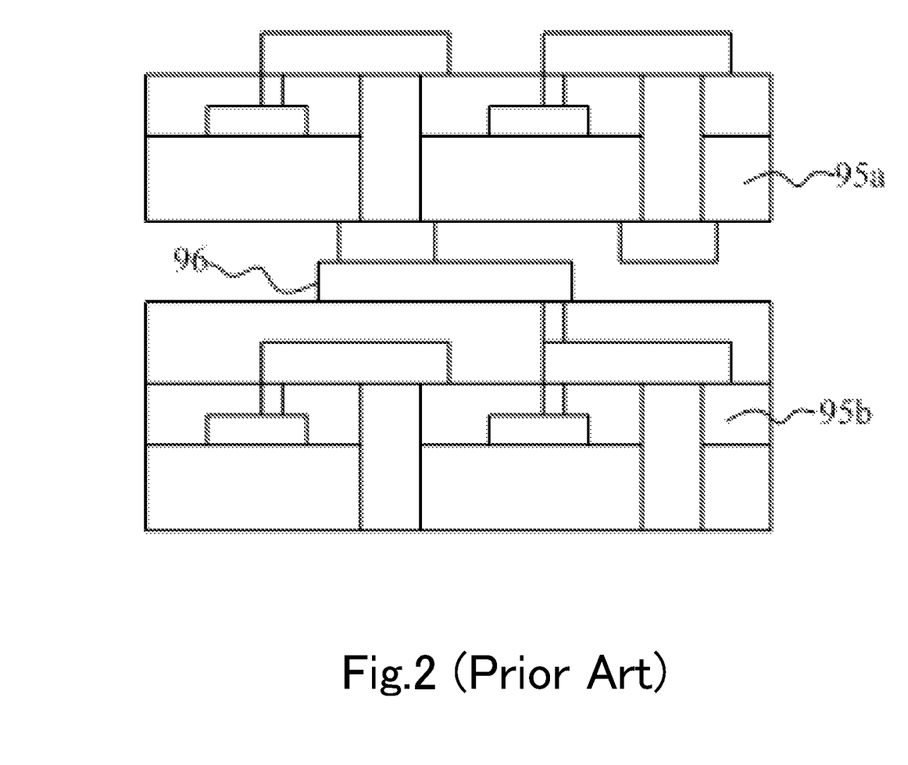
FIG. 2 illustrates a schematic view of another conventional stacked structure of chips.

FIGS. 1 and 2 illustrate a schematic view of a conventional stacked structure of chips, respectively. FIG. 1 shows that each of chip layer (for example 90a) includes a substrate 901, a dielectric layer 902 formed on the substrate 901, an internal circuit 912 surrounded by the dielectric layer 902, and a metallic layer 911 formed on the dielectric layer 902 connected to the internal circuit 912 through a through hole via 903. When the conventional through silicon via (TSV) 93a and 93b are utilized for two chip layers 90a and 90b in stacking process, the metallic layer 911 is coupled to the internal circuit 912 and engaged to solder bumps 92 on the back side of top chip 90a.

On the other hand, as shown in FIG. 2, if the upper and lower chip layers 95a, 95b need to be distinguished or selected respectively, it usually add a second metallic layer 96 to achieve the purpose. The disadvantage is the need of at least two metal layers such that manufacturing costs will be increased.

Currently, many improved stacked structures are proposed, for example, U.S. Pat. No. 7,816,776 described therein, which characterized in that two adjacent chips layers have a symmetrical connection bumps and through hole via so that a parallel path and a serial path can be formed, and with operation of internal circuit to differentiate each chip layer of chips layers.

SUMMARY OF THE INVENTION

The purpose of the invention is to reduce necessary number of metal layers provided for distinct circuit and select circuit for 3D chips stacked structure.

Another purpose of the invention is to propose a simpler process and low manufacturing cost for 3D chips stacked structure.

To achieve the above-mentioned purpose, one feature of the invention is proposed a three dimensional chips stacked structure, comprising plural chips layers, each of said plural chips layers having plural single-layered conductive members formed thereon, each of said plural single-layered conductive members having a test pad formed thereon, wherein two adjacent said single-layered conductive members for said each of said plural chips layers are structurally formed in mirror symmetry with each other along a chip longitudinal direction and an arrangement of said plural single-layered conductive members of two adjacent chip layers are shifted by a predetermined distance, and said plural single-layered conductive members of said two adjacent chip layers communicated through a vertical TSV.

The proposed scheme may make the input signal via test pad of top chip layer laterally transmitting to adjacent test pad and internal circuit of underlying chip layer via TSV.

Furthermore, mask design and consequent process can be simplified with respect to a multiple metal layer design and overall dimension of the package and manufacturing cost can be reduced. Thus, the proposed chip stacked structure can realize a compact semiconductor device, wherein mask design for making single-layered conductive members for signal transmitting on different locations becomes quite simplified such that the overall process yield effectively enhances and the manufacturing cost also reduces.

Each of plural single-layered conductive members includes a pad branch and a non-pad branch, wherein the test pad is configured on the pad branch. For the two adjacent chip layers, at least one the single-layered conductive members of top chip layer extends from the non-pad branch vertically downward to corresponding single-layered conductive member of underlying chip layer by TSV. The plural single-layered conductive members may be L-shaped. Material of plural single-layered conductive members is metal, such as copper.

Each of plural single-layered conductive members is connected to a corresponding distinct circuit. The corresponding distinct circuit includes an input terminal connected to a drain electrode of a first N-type metal oxide semiconductor field effect transistors (NMOS), a output terminal connected to a lock control circuit, a gate electrode of the first NMOS connected to a reset signal source, a source electrode of the first NMOS connected to ground. The lock control circuit includes a first inverter, a second converter, a second NMOS and a third NMOS. Output terminal is connected to an input terminal of the first inverter and a source electrode of the second NMOS, and an output terminal of the first inverter is connected to an input terminal of the second inverter and a gate electrode of the second NMOS. Output terminal of the second inverter is connected to a gate electrode of the third NMOS, a drain electrode of the second NMOS is connected to a source electrode of the third NMOS, and a drain electrode of the third NMOS is connected to ground. A connecting wire is used to connect to the source electrode of the third NMOS for all lock control circuits.

Moreover, one of the single-layered conductive members on far left side or right side for each chip layer is connected to a select circuit for controlling the selection of specific chip layer.

Shape of the test pad may be any shape, such as square. Material of the test pad is for example aluminum, silver or copper.

BRIEF DESCRIPTION OF THE DRAWINGS

The attached specifications and drawings outline the preferred embodiments of the invention, including the details of its components, characteristics and advantages.

DETAILED DESCRIPTION

The invention provides a novel three-dimensional stacked structure of chips. The basic stacked structure comprises a plurality of chips layers, wherein each chip layer comprises a plurality of single-layered conductive members arranged in sequence on top side of the chip layer in chip direction, and each of single-layered conductive members includes a pad branch and a non-pad branch, a test pad is set on the pad branch. In each chip layer, the adjacent two single-layered conductive members is symmetric with offset by a predetermined distance, and two adjacent test pads is separated by a predetermined distance along the chip direction. The arrangements of the single-layered conductive members of the two adjacent chip layers are shifted by a predetermined offset distance (ie, spacing of test pad). For two adjacent chip layers, the last one of the single-layered conductive members of top chip layer is connected to an isolated conductive member, non-pad branches on any one of others single-layered conductive members of top chip layer are connected vertically to the corresponding single-layered conductive member of underlying chip layer via TSV.

In order to obtain a more complete understanding for purposes and advantages of the invention, the best mode and the following specific embodiments of the invention are proposed for detail description. The following description of the invention is only to illustrate its general principles, which should not be restricted the invention but to illustrate different embodiments. Therefore, the proposed modification is not to limit the scope of the invention. Various equivalents, changes and modification may be provided by person skilled in the art without departing from the scope of the invention, and may be understood that such embodiments are to be included herein. The term used in the following description of the invention is interpreted as its broadest reasonable meaning, and even a detailed description of the specific embodiment of the invention was used. Some terms may be emphasized, but the term trying to be explained will be specially defined in some embodiments. If the use of "a" or "plurality" in the text allows to describe the terms which may include plural or single situation. In addition, unless it represents a single term and exclusion list containing two or more items, the use of "or" in the text should be interpreted to include (a) a single item of lists, (b) all items of lists, or (c) any items combination of lists.

Figure 3:
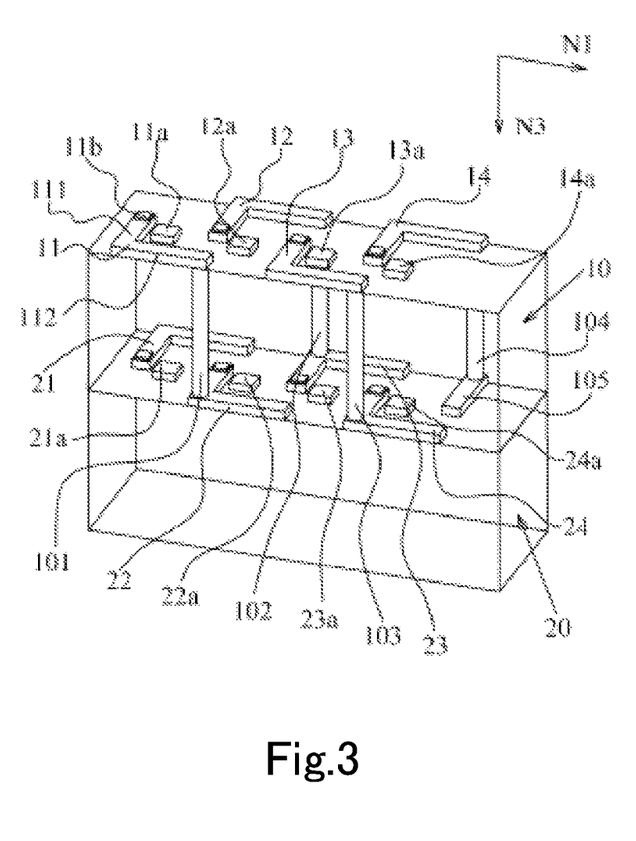
FIG. 3 illustrate a schematic view of a stacked structure of two chips layers with distinct circuits in a first preferred embodiment.
Figure 4:
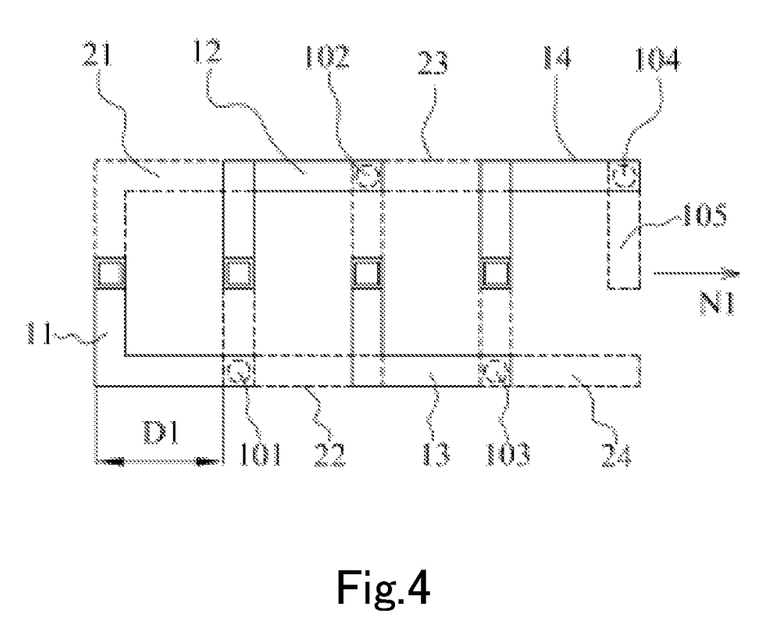
FIG. 4 illustrate a top view of the structure of the FIG. 3 with single-layered conductive members.

Referring to FIGS. 3 and 4, they show a schematic view and a top view of a stacked structure of two chips layers with distinct circuits in a first preferred embodiment. In this embodiment, order of plurality of chips layers is numbered by order number increment from top to bottom, and order of a plurality of single-layered conductive members and test pads in a single chip layer is numbered by order number increment from left to right. For example, in the stacked structure of two chips layers shown in the figure, top layer is first chip layer 10 and lower layer is second chip layer 20, wherein the first chip layer 10 shows four single-layered conductive members including first single-layered conductive member 11, second single-layered conductive member 12, third single-layered conductive member 13, and fourth single-layered conductive member 14, from left to right.

Each single-layered conductive member, for example the first single-layered conductive member 11, includes pad branch 111 and non-pad branch 112, wherein between the two branches has an included angle, e.g. 90 degrees, and a test pad 11b is configured on the pad branch 111. In this example, all single-layered conductive members radiate (show) L-shaped, but this will not be construed as limited the invention. Each of the single-layered conductive members 11~14 is connected to internal distinct circuit of chip 11a~14a, respectively. In this example, test pads are square aluminum pad, but also for other metal material, and may be any other shape such as rectangle or circle. In the invention, signal received by single-layered conductive member of top chip layer (lower chip layer) may be transmitted to the internal distinct circuit adjacent test pad of lower chip layer (top chip layer) for corresponding test pad in vertical direction.

All single-layered conductive member s are arranged in sequence along a chip longitudinal direction (axial N1), so that all test pads are aligned substantially along the chip longitudinal direction.

Especially, in the first chip layer 10, two adjacent single-layered conductive members (11, 12), (12, 13), (13, 14) for four single-layered conductive members 11, 12, 13, 14 are structurally formed in mirror symmetric way with each other along the chip longitudinal direction.

On the other hand, in the second chip layer 20, four single-layered conductive members 21, 22, 23, 24 are included. As shown in figure, layout (arrangements) of the single-layered conductive members of the second chip layer 20 is right shifted by a test pad distance D1 (along the chip longitudinal direction), relative to the first chip layer 10. Of course, each of the single-layered conductive members 21~24 is connected to internal distinct circuit of chip 21a~24a, respectively.

The conductive member of the first chip layer 10 is connected to the conductive member of the second chip layer 20 by conventionally through silicon vias (TSV) technology. For example, TSV 101 (of course, the hole is filled with a conductive material, gold or copper, to achieve the desired purpose of electrical conduction, for example, by electroplating method) extends from non-pad branch 112 of the first single-layered conductive member 11 of the first chip layer 10 vertically downward to turning point of L-shaped of the second single-layered conductive member 22 of the second chip layer 20 along chip height direction (axial N3). The second single-layered conductive member 12 of the first chip layer 10 is connected to the third single-layered conductive member 23 of the second chip layer 20 by TSV 102. Similarly, the third single-layered conductive member 13 of the first chip layer 10 is connected to the fourth single-layered conductive member 24 of the second chip layer 20 by TSV 103. Therefore, two single-layered conductive members connected by TSV between two adjacent chip layers will be the same arrangement direction, and the arrangements of TSVs of the two adjacent chip layers are right shifted by a test pad distance D1.

Furthermore, the figure also shows that the rightmost fourth single-layered conductive member 14 of the first chip layer 10 is connected to rightmost single-strip conductive member 105 of the second chip layer 20 by TSV 104. The single strip conductive member 105 indicates that regular single-layered conductive member structure can be truncated to reduce waste of space as the subsequent extension connection is without needed.

Figure 5:
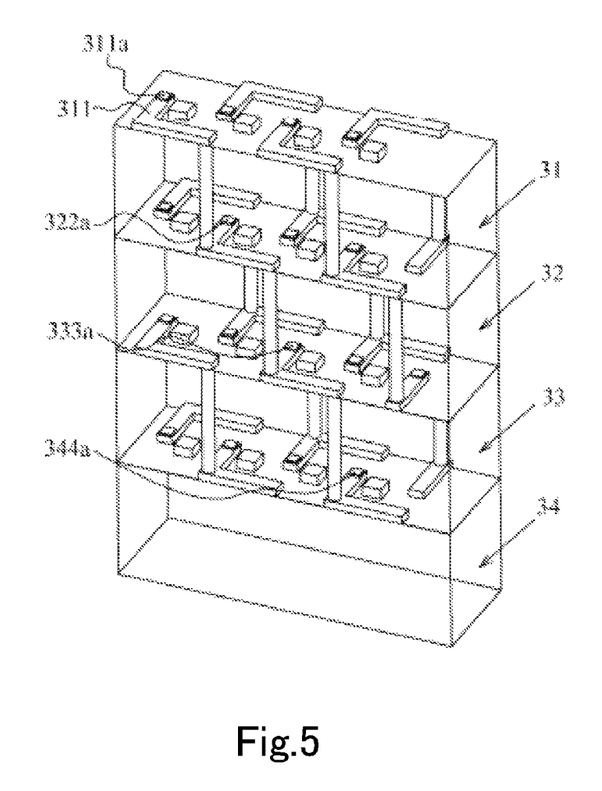
FIG. 5 illustrate a schematic view of a stacked structure of four chips layers with distinct circuits in a second preferred embodiment.

In this embodiment, the stacked structure of four chips layers is proposed based-on the first embodiment, shown in FIG. 5. In this embodiment, the structural characteristics of each chip layer 31~34 will be the same as the first embodiment, and therefore the detailed description is omitted. The arrangements of single-layered conductive members of the first chip layer 31 are the same as the third chip layer 33, and arrangements of single-layered conductive members of the second chip layer 32 are the same as the fourth chip layer 34. The single-layered conductive members between adjacent chip layers are connected by TSV as the previous example.

Therefore, it can be summarized as a rule: in a multi-chips layer structure, (M-th) single-layered conductive member of (N-th) chip layer is serially connected to (M+1)-th single-layered conductive member of (N+1)-th chip layer, (M+2)-th single-layered conductive member of (N+2)-th chip layer, (M+3)-th single-layered conductive member of (N+3)-th chip layer, . . . by TSVs.

Operations of distinct circuits of the stacked structure of chips are summarized below. Chips on the stacked structure are activated as maintain a determined voltage, a relatively high voltage is applied to first test pads 311a on the first single-layered conductive member 311 of the first chip layer 31, and followed by serially applying to second test pads 322a of the second chip layer 32, third test pads 333a of the third chip layer 33, and fourth test pads 344a of the fourth chip layer 34, in order to achieve the purpose of turning on the internal distinct circuit of each chip layer. Other internal distinct circuits (without turning on by the relatively high voltage) of each chip layer need to be forced down to a relatively low voltage.

Figure 6:
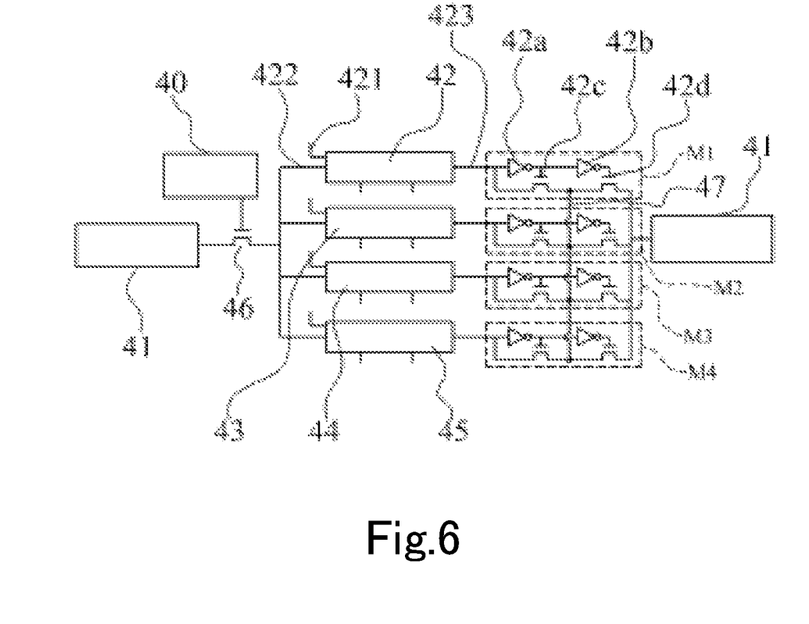
FIG. 6 illustrate a schematic view of a distinct circuit and its control-related circuit in the second preferred embodiment.

Referring to FIG. 6, a schematic view of distinct circuit and its control-related circuit in the second preferred embodiment. In a single chip layer (for example, the first chip layer 31), each of distinct circuits 42~45, for example the first distinct circuit 42, has a first input terminal 421 for receiving input signals (from test pad or TSV) and a second input terminal 422 connected to a drain electrode of the first N-type metal oxide semiconductor field effect transistors (NMOS) 46. Gate electrode of the first NMOS 46 is connected to a reset signal source 40, a source electrode of the first NMOS 46 is connected to ground 41 (provided Vss voltage).

Output terminal 423 of the distinct circuit 42 is connected to ground 41 through a lock control circuit M1. The lock control circuit M1 includes two inverters 42a, 42b, and two N-type metal oxide semiconductor field effect transistors (NMOS) 42c, 42d. Specifically, the output terminal 423 is connected to an input terminal of first inverter 42a and a source electrode of second NMOS 42c, respectively, and output terminal of the first inverter 42a is connected to an input terminal of second inverter 42b and a gate electrode of second NMOS 42c, respectively. Output terminal of second inverter 42b is connected to a gate electrode of third NMOS 42d, and a drain electrode of the second NMOS 42c is connected to a source electrode of the third NMOS 42d. Drain electrode of the third NMOS 42d is connected to ground 41. In addition, a connecting wire 47 is used to connect to the source electrode of the third NMOS for all lock control circuits M1~M4.

Reset signal source 40 receives a relatively high voltage clock when chip turns on, and then back to a relatively low voltage. All distinct circuits 42~45 are connected to a low voltage Vss as maintain non-activation, and outputting low voltage such that the right second NMOS turns on and the third NMOS turns off. All distinct circuits are in relatively low voltage and temporarily in floating state.

Then, the external controller (not shown) begins to feed a relatively high voltage to distinct circuits (e.g., the first distinct circuit 42 in figure) connected to each other for stacked chips layers through test pads or TSV. Right output terminal of the distinct circuit outputs a relatively high voltage, and then the second NMOS turning off, and the third NMOS turning on. Because the second NMOS is turned on, other distinct circuits 43~45 without applying a relatively high voltage in the identical chip layer are linked to the activated right third NMOS as distinct circuits are applied the relatively high voltage, so that all distinct circuits without applying a relatively high voltage are changing from a floating state to a relatively low voltage Vss to ensure only one distinct circuit for each chip layer in a relatively high voltage state. The distinct circuit 42 in a relatively high voltage outputs signal to determine the chip itself layer number.

As noted above, it shows that benefit of the invention is to save considerable space of the layout to make chips stacked overall structure more compact. Layout of single-layered conductive member for each chip layer has a simple rule and feature. It can only use a design of single-layered arrangements to achieve the arrangements of single-layered conductive members required for all chips layers (arrangements of single-layered conductive members for adjacent layers may be determined by a distance shift), and therefore cost of manufacture can be highly reduced and provide a simpler process.

Figure 7:
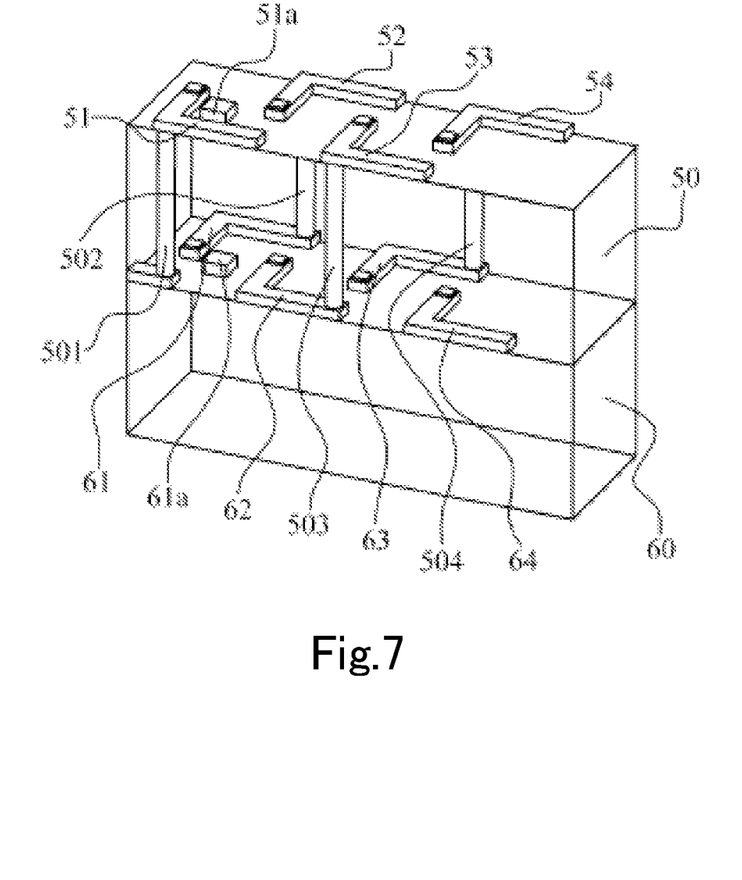
FIG. 7 illustrate a schematic view of a stacked structure of two chips layers with select circuits in a third preferred embodiment.

Referring to FIG. 7, it shows a schematic view of a stacked structure of chips with select circuit of the third preferred embodiment of the invention. This example shows a bi-layers chips stacked structure, wherein structure and arrangement of single-layered conductive members 51~54 (61~64) of each chip layer 50 (60) are similar to that of the first embodiment, and therefore the detailed description is omitted. The single-layered conductive member of top chip layer is connected to the single-layered conductive member of lower chip layer through TSV, left offset a test pad distance. Figure clearly shows that only single-layered conductive members 51 and 61 on far left side for each chip layer are connected to a select circuit 51a, 61a respectively used to select a specific layer. Each of TSVs 501~504 extends from turning point of the single-layered conductive member 51~54 of the top chip layer 50 vertically downward connected to non-pad branch of single-layered conductive member 61~64 of the lower chip layer 60.

Figure 8:
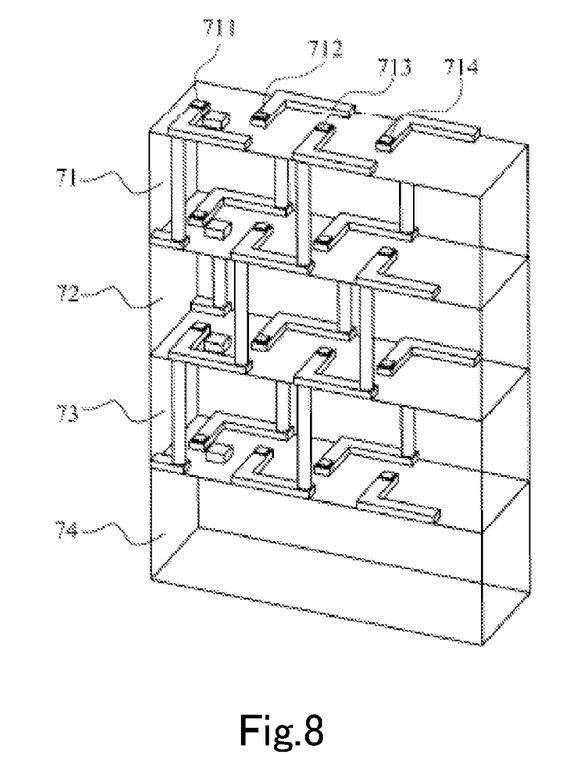
FIG. 8 illustrate a schematic view of a double bi-layers stacked structure of four chips layers with select circuits in a fourth preferred embodiment.

Referring to FIG. 8, it shows a schematic view of a double bi-layers stacked structure of chips of above embodiment. In this example, structure and arrangement of each chip layer 71~74 are similar to that of the third embodiment, and therefore the detailed description is omitted. The arrangements of single-layered conductive members of the first chip layer 71 are the same as the third chip layer 73, and arrangements of single-layered conductive members of the second chip layer 72 are the same as the fourth chip layer 74.

When the stacked chips operate, each chip layer may be selected for each test pads 711~714 of first chip layer 71. For example, when first test pads 711 is applied to a relatively high voltage, others test pads 712~714 are applied to a relatively low voltage, and the first chip layer 71 is selected; when second test pad 712 is applied to a relatively high voltage, others test pads 711, 713, 714 are applied to a relatively low voltage, and the second chip layer 72 is selected, and so on.

The select circuit is connected to the single-layered conductive member on far left side of each chip layer in the third and fourth embodiment, but may be designed to connect to the single-layered conductive member on far right side of each chip layer.

Figure 9:
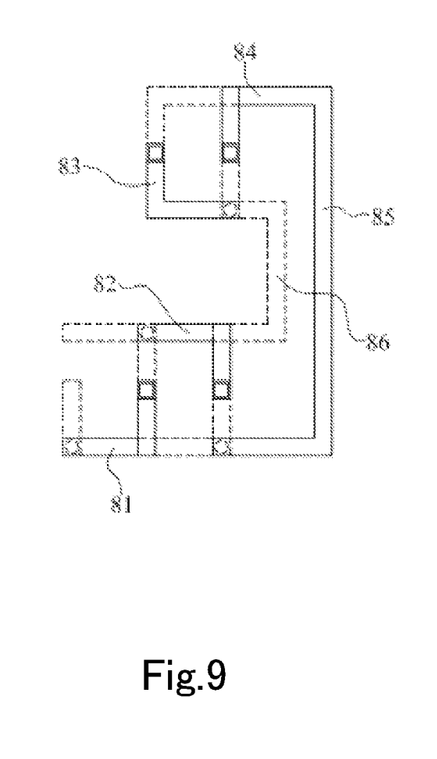
FIG. 9 illustrate a multilayer stacked structure of chips in a fifth preferred embodiment of the invention.

Referring to FIG. 9, it shows a multilayer stacked structure of chips in a fifth preferred embodiment of the invention. This example is a modification based-on the first embodiment. As shown in figure, two single-layered conductive members 81, 82 of underlying chip layer have the features of the two adjacent conductive members with mirror symmetry and the arrangements of the single-layered conductive members of the two adjacent chip layers shifted or arranged offset by a distance (solid line indicates top chip layer, dashed lines indicates underlying chip layer), and single-layered conductive members of the two adjacent chip layers are connected each other via TSV. Of course, two single-layered conductive members 83, 84 of top chip layer are also meet with these restrictions. In these embodiments, single-layered conductive member of the top chip layer can be making some simple modifications to connect to single-layered conductive member of the underlying chip layer via TSV. As shown in figure, single-layered conductive member 84 of top chip layer is modified by adding a modification section 85, and single-layered conductive member of underlying chip layer is modified by adding a modification section 86. Such configuration is also within the scope of the invention.

What is claimed is:

1. A three dimensional chips stacked structure, comprising plural chips layers, each of said plural chips layers having plural single-layered conductive members formed thereon, each of said plural single-layered conductive members having a test pad formed thereon, wherein two adjacent said single-layered conductive members for said each of said plural chips layers are structurally formed in mirror symmetry with each other along a chip longitudinal direction and an arrangement of said plural single-layered conductive members of two adjacent chip layers are shifted by a predetermined distance, and said plural single-layered conductive members of said two adjacent chip layers communicated through a vertical TSV.

2. The structure of claim 1, wherein said each of said plural single-layered conductive members includes a pad branch and a non-pad branch, wherein said test pad is configured on said pad branch.

3. The structure of claim 2, wherein for said two adjacent chip layers, at least one said single-layered conductive members of top chip layer extends from said non-pad branch vertically downward to corresponding single-layered conductive member of underlying chip layer by said TSV.

4. The structure of claim 2, wherein between said pad branch and said non-pad branch has an included angle.

5. The structure of claim 1, wherein said plural single-layered conductive members is L-shaped.

6. The structure of claim 1, wherein a material of said plural single-layered conductive members is copper.

7. The structure of claim 1, wherein said each of plural single-layered conductive members is connected to a corresponding distinct circuit.

8. The structure of claim 7, wherein said corresponding distinct circuit of any one of said plural chips layers is applied to a relatively high voltage, others corresponding distinct circuit of said plural chips layers is applied to a relatively low voltage.

9. The structure of claim 1, wherein said corresponding distinct circuit includes an input terminal connected to a drain electrode of a first N-type metal oxide semiconductor field effect transistors (NMOS), a output terminal connected to a lock control circuit, a gate electrode of said first NMOS connected to a reset signal source, a source electrode of said first NMOS connected to ground.

10. The structure of claim 9, wherein said lock control circuit includes a first inverter, a second converter, a second NMOS and a third NMOS.

11. The structure of claim 10, wherein said output terminal is connected to an input terminal of said first inverter and a source electrode of said second NMOS, and an output terminal of said first inverter is connected to an input terminal of said second inverter and a gate electrode of said second NMOS.

12. The structure of claim 11, wherein an output terminal of said second inverter is connected to a gate electrode of said third NMOS, a drain electrode of said second NMOS is connected to a source electrode of said third NMOS, and a drain electrode of said third NMOS is connected to ground.

13. The structure of claim 12, wherein a connecting wire is used to connect to said source electrode of said third NMOS for all lock control circuits.

14. The structure of claim 1, wherein one of said single-layered conductive members on far left side for each chip layer is connected to a select circuit.

15. The structure of claim 1, wherein one of said single-layered conductive members on far right side for each chip layer is connected to a select circuit.

16. The structure of claim 1, wherein said test pad is square aluminum pad.

* * * * *